(12) United States Patent
Maruyama et al.

(10) Patent No.: US 6,298,669 B1
(45) Date of Patent: Oct. 9, 2001

(54) PIPE COOLER AND SMALL-SIZED TEMPERATURE CONTROLLING APPARATUS USING THE SAME

(75) Inventors: Hidetoshi Maruyama; Hiroyuki Sakama, both of Ibaraki (JP)

(73) Assignee: SMC Corporation, Tokyo (JP)

( * ) Notice: Subject to any disclaimer, the term of this patent is extended or adjusted under 35 U.S.C. 154(b) by 0 days.

(21) Appl. No.: 09/688,086

(22) Filed: Oct. 16, 2000

(30) Foreign Application Priority Data

Nov. 2, 1999 (JP) .................................................. 11-312693

(51) Int. Cl.$^7$ ...................................................... F25B 21/02
(52) U.S. Cl. ...................................................... 62/3.2; 62/3.7
(58) Field of Search ................................... 62/3.1, 3.2, 3.3, 62/3.7; 165/104.21

(56) References Cited

U.S. PATENT DOCUMENTS 3,212,274 * 10/1965 Eidus ............................................ 62/3
3,834,171 * 9/1974 Johansson ..................................... 62/3
6,233,944 * 5/2001 Yamada et al. ............................ 62/3.7

FOREIGN PATENT DOCUMENTS 57-147059-A * 9/1982 (JP) ......................................... 62/3.2
11-063722    3/1999 (JP) .

* cited by examiner

Primary Examiner—Henry Bennett
Assistant Examiner—Melvin Jones
(74) Attorney, Agent, or Firm—Oblon, Spivak, McClelland, Maier & Neustadt, P.C.

(57) ABSTRACT

A Peltier element 4 is fixedly brought in close contact with a surface of a heat exchange block 3 with a large heat capacity which performs heat exchange with an end portion 2a of a heat pipe 2, heat transferring means 5 is disposed on a side of the Peltier element 4 which is opposed to the heat exchange block 3, the heat pipe 2 has at least one heat conduction extending portion 2b projecting from the heat exchange block 3, and heating medium about the heat conduction extending portion 2b is temperature-controlled by the operation control of the Peltier element 4 via the heat exchange block 3 and the heat conduction extending portion 2b of the heat pipe 2.

11 Claims, 4 Drawing Sheets

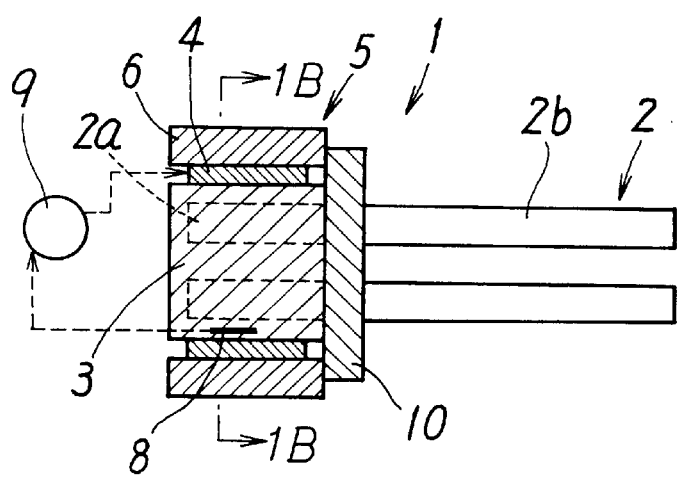
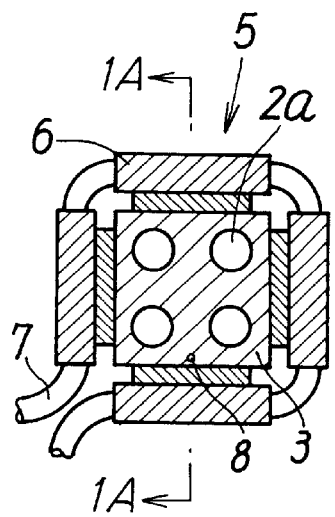
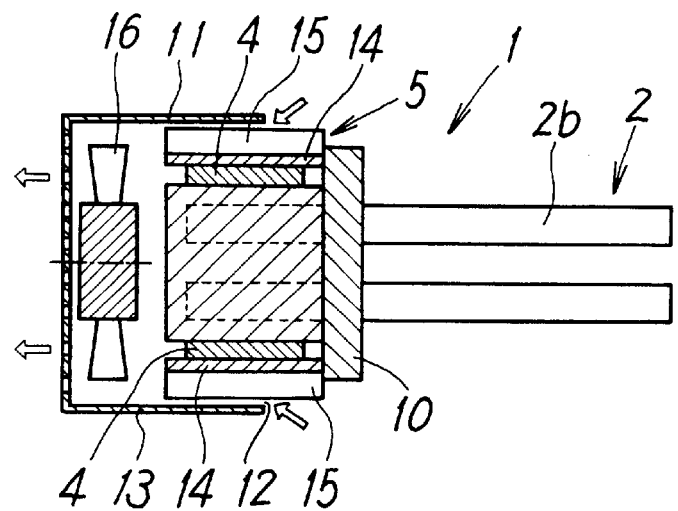
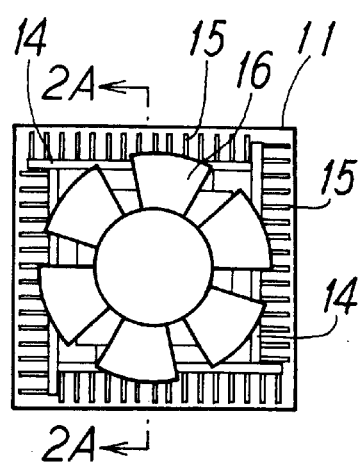

PIPE COOLER AND SMALL-SIZED TEMPERATURE CONTROLLING APPARATUS USING THE SAME

TECHNICAL FIELD

The present invention relates to a pipe cooler which performs temperature control by cooling (or heating) erosive fluid (liquid which is apt to be damaged by metal irons, such as developing liquid, photo resist or the like) flowing in such a flow path as a pipe or the like in a semiconductor-related device manufacturing apparatus, and a small-sized temperature controlling apparatus using the pipe cooler.

PRIOR ART

As shown in FIG. 6, when developing liquid, photo resist, or the like which is supplied to a semiconductor wafer W intermittently is temperature-controlled, that is, when erosive fluid flowing in a flow path intermittently is temperature-controlled with a high accuracy, the temperature control of the fluid has been conventionally preformed by causing fluid to be temperature-controlled to flow in an anti-corrosive tube 63 made of fluorocarbon resin (trade name: Teflon) or the like, configuring a heat exchange portion 62 such that constant-temperature water 65 which has been temperature-controlled to a target temperature of the fluid in a constant-temperature water circulating apparatus 61 is caused to flow outside the tube 63, and circulating the constant-temperature water 65 in a circulating flow path 64.

For this reason, the constant-temperature water circulating apparatus 61 and the circulating flow path 64 for flow of constant-temperature water are required. Since these apparatuses require a large space for installation, such an arrangement is employed in many cases that the constant-temperature water circulating apparatus 61 is installed on a first floor of a building and a coater/developer main body of a semiconductor manufacturing apparatus is installed on a second floor thereof. As a result, a leading of a long piping for constant-temperature water with a high head becomes necessary.

Also, in the long piping for constant-temperature water with a high head, a high head pump must be used as the pump for flow of constant-temperature water, which leads to increase in pump power for circulating constant-temperature water other than the corrosive water, which results in increase in electric power.

Furthermore, as mentioned above, in the long piping for constant-temperature water with a high head, since heat radiation and heat absorption from the piping are increased, it becomes necessary to further increase the cooling capacity of the constant-temperature water circulating apparatus 61.

Also, as an apparatus for temperature-controlling erosive fluid, there is one using a Peltier element as shown in FIG. 7.

In a temperature controlling apparatus shown in FIG. 7, a Peltier element 71 serving as a thermo module is fixedly brought in close contact with a surface of heat exchange block 72 having a large heat capacity, which performs heat exchange with erosive fluid flowing in a flow path 74, and heat transferring means 73 is fixedly brought in close contact with a portion of the Peltier element 71 which is opposed to the heat exchange block 72, so that the erosive fluid is temperature-controlled to a target temperature by operation control of the Peltier element 71.

In the temperature controlling apparatus, since the heat exchange block 72 is disposed on a heat absorbing side (namely, a cooling surface side) of the Peltier element 71 and the heat transferring means 73 is disposed on a heat radiation side (namely, a heating surface side) of the Peltier element 71, the erosive fluid flowing in the flow path 74 is cooled by the Peltier element 71 through the heat exchange block 72 and the heat radiated from the erosive fluid is transferred to the heat radiating side of the Peltier element 71 to be radiated by heat conduction to cooling water flowing in a pipe 75 within the heat transferring means 73.

However, in the conventional temperature controlling apparatus shown in FIG. 7, (1) a heat conduction area is limited by the shape/size of the thermo module, so that it is difficult to reduce heat resistances of both the heat radiating side and the heat absorbing side.

Furthermore, (2) since the shape/size of the thermo module is limited, there is no degree of freedom for designing the temperature controlling apparatus optimally so as to coincide with the size required for the heat exchanger.

Form the above, there is a problem that a temperature difference between the heat radiating side and the heat absorbing side applied to the thermo module can not be effectively utilized so that the heat exchanger is large-sized or electric power can not be utilized effectively.

DISCLOSURE OF THE INVENTION

An object of the present invention is to provide a pipe cooler where installation of a large-sized constant-temperature water circulating apparatus is not required in a case that strong erosive fluid such as metal corrosion fluid is temperature-controlled with a high accuracy and which allows simplification and small-sizing of an apparatus, and a small-sized temperature controlling apparatus using the pipe cooler.

Another object of the invention is to provide a pipe cooler which solves the problems in the above conventional art when the erosive fluid is temperature-controlled, and a small-sized temperature controlling apparatus using the pipe cooler.

In order to the solve the above problems, a pipe cooler according to the present invention comprises at least one heat pipe having an end portion for heat exchange and a heat conduction extending portion extending form the end portion, a heat exchange block for performing heat exchange with the end portion of the at least one heat pipe, at least one Peltier element which is fixedly brought in close contact with a surface of the heat exchange block, and heat transferring means which is provided on a surface of each Peltier element which is opposed to the heat exchange block, wherein heating medium about the heat conduction extending portion is temperature-controlled by controlling the Peltier element via the heat exchange block and the heat pipe.

The heat transferring means may be structured so as to radiate heat from the heating surface of the Peltier element by water cooling or air cooling.

According to a specific embodiment of the present invention, the heat exchange block has a polygonal sectional configuration, the heat exchange block is mounted at its one end face with end portions of a plurality of heat pipes in an embedded state, and the Peltier elements are mounted to a plurality of side faces around the one end face.

According to one embodiment of the present invention, the heat transferring means comprises cooling plates each having a flow passage for cooling water therein, and the flow passages of the respective cooling plates are connected mutually by a pipe.

According to another embodiment of the present invention, the heat transferring means comprises cooling plates each having a plurality of fins for heat radiation, a rectangular cover is mounted to the heat exchange block so as to enclose the fins of the respective cooling plates, and a fan is provided inside the cover.

Also, according to the present invention, there is provided a small-sized temperature controlling apparatus comprising a pipe cooler which has the above structure, a heating medium accommodating casing which encloses the heat conduction extending portion of the heat pipe, a heating medium chamber which is formed inside the heating medium accommodating casing, and heating medium which is accommodated within the heating medium chamber so as to come in contact with the heat conduction extending portion of the heat pipe.

According to a preferable specific embodiment of the present invention, a tube for allowing flow of fluid to be temperature-controlled is provided so as to surround the heat conduction extending portion of the heat pipe and contact with the heating medium.

In the present invention, the heating medium may be liquid or solid. When the liquid is used, it is preferable that a pump casing is provided at one end of the heating medium accommodating casing and a pump for circulating the heating medium is provided inside the pump casing.

According to another embodiment of the present invention, the heating medium accommodating casing is formed in a double cylindrical shape comprising an outer cylindrical portion and an inner cylindrical portion, the heating medium chamber is formed between the both cylindrical portions, the heating medium chamber and the pump casing communicate with each other via the inner cylindrical portion, and the heat conduction extending portion of the heat pipe is accommodated between the outer cylindrical portion and the inner cylindrical portion.

BRIEF DESCRIPTION OF THE DRAWINGS

FIG. 1(A) and 1(B) are sectional views showing an embodiment of a pipe cooler according to the present invention, FIG. 1(A) being a sectional view taken along line 1A—1A in FIG. 1(B) and FIG. 1(B) being a sectional view taken along line B—B in FIG. 1(A).

FIG. 2(A) and 2(B) are sectional views showing another embodiment of a pipe cooler according to the present invention, FIG. 2(A) being a sectional view taken along line 2A—2A in FIG. 2(B) and FIG. 2(B) being a left side view of FIG. 2(A).

DETAILED DESCRIPTION

Figure 3:
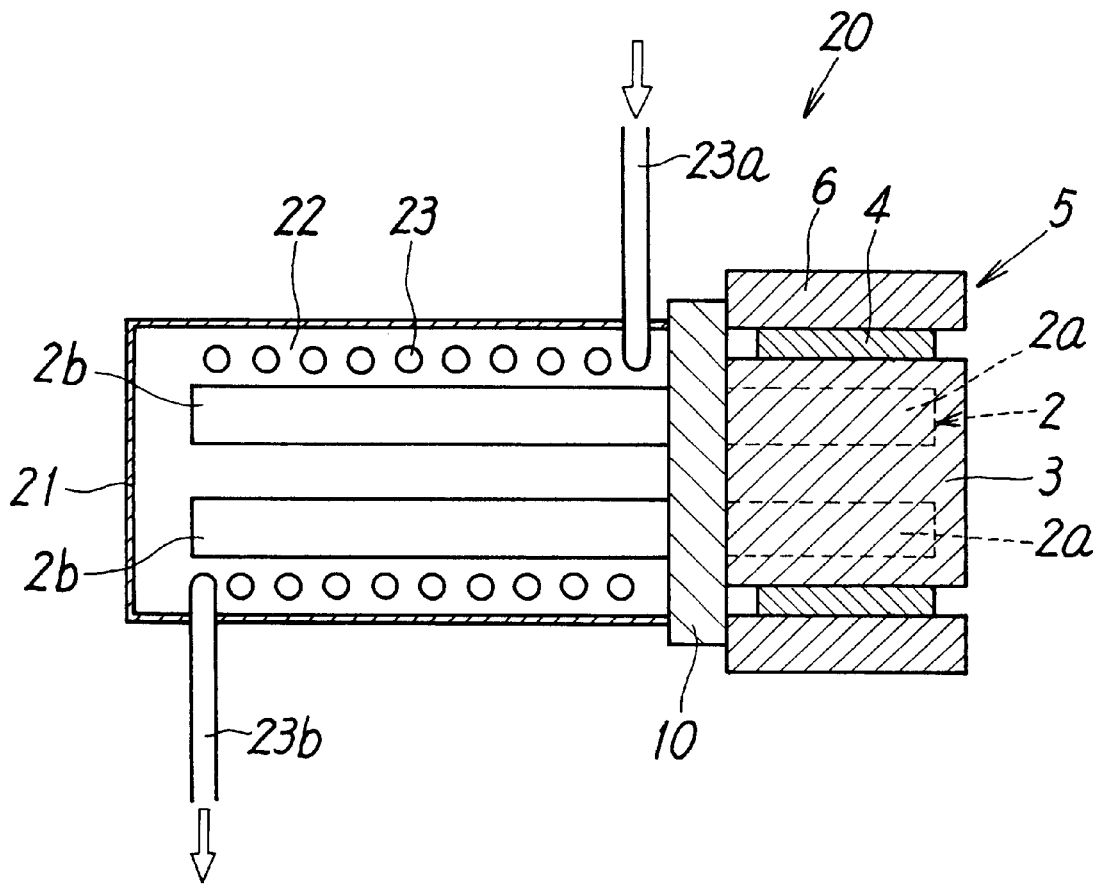
FIG. 3 is a sectional view showing an embodiment of a small-sized temperature controlling apparatus according to the present invention.

FIG. 1 is a sectional view showing an embodiment of a pipe cooler according to the present invention.

A pipe cooler 1 according to the present invention comprises a heat pipe(s) 2 and a heat exchange block 3 with a large heat capacity. At least one heat pipe 2 is mounted to the heat exchange block 3 by heat pipe supporting means 10, it has an end portion 2a which is inserted into the heat exchange block 3 to perform heat exchange with the heat exchange block 3 and a heat conduction extending portion 2b projecting form the heat exchange block 3, and heat from the heat exchange block 3 is conducted to heating medium about the heat conduction extending portion 2b.

Furthermore, in the pipe cooler 1 according to the present invention, a Peltier element 4 which is a thermo module is fixedly brought in close contact with a surface of the heat exchange block 3, and heat transferring means 5 is disposed on a side of the Peltier element 4 which is opposed to the heat exchange block 3.

In the embodiment of FIG. 1, the heat transferring means 5 is cooling plates 6 having a flow passage for cooling water therein, and the flow passages of the cooling plates 6 are mutually connected by a pipe 7, so that the cooling water flows in and flows out of the cooling plate through the pipe 7.

The heat exchange block 3 has a temperature sensor 8 therein, and a signal from the temperature sensor 8 is sent to a temperature controller 9, so that the current flowing in the Peltier element 4 from a direct current power supply (not shown) is controlled by the temperature controller 9 and the temperature of the Peltier element 4 is controlled.

Normally, a surface of the Peltier element 4 which is positioned on the side of the heat exchange block 3 is a cooling surface, while a surface of the Peltier element 4 which is positioned on the side of the heat transferring means 5 is a heating surface, and the heat transferring means 5 performs heat radiation from the heating surface of the Peltier element 4.

The pipe cooler according to the present invention is structured so as to perform temperature control by cooling heating medium about the heat conduction extending portion, but it may be structured so as to perform temperature control by heating the heating medium by reversing the direction of current flowing in the Peltier element 4.

When the direction of current flowing in the Peltier element 4 is reversed, the surface of the Peltier element 4 which is positioned on the side of the heat exchange block 3 serves as the heating surface, while the surface of the Peltier element 4 which is positioned on the side of the heat transferring means 5 serves as the cooling surface. Since heating temperature control is temporarily performed in such a case that the temperature of heating medium is over-lowered, it is unnecessary to replace the cooling plate 6 with a heating plate even when the direction of current flowing in the Peltier element 4 is reversed in this manner, and such a heating temperature control can be achieved sufficiently by reducing the cooling capacity of the cooling plate 6 by such a processing as stopping flowing of cooling water into the cooling plate 6 or reducing the amount of the cooling water flowing therein.

Accordingly, the pipe cooler according to the present invention can control the temperature of the heating medium about the heat conduction extending portion via the heat exchange block and the heat conduction extending portion of the heat pipe accurately by operation control of the Peltier element easily and with an excellent response.

Then, since the pipe cooler of the present invention is structured such that the heat exchange is performed between the end portion of the heat pipe and the heat exchange block with a large heat capacity and the heating medium about the heat conduction extending portion is temperature-controlled by operation control of the Peltier element via the heat conduction extending portion of the heat pipe projecting from the heat exchange block, the length/thickness of the heat conduction extending portion of the heat pipe can be designed freely without restriction due to the dimension of the heat exchange block, and the heat conduction extending portion of the heat pipe can be formed in an enlarged heat conduction surface, so that heat conduction can be performed to heating medium about the heat conduction extending portion sufficiently.

Accordingly, since the heat resistance of the Peltier element which is positioned on the heat absorbing side is made small, a temperature difference between the heat radiating side and the heat absorbing side of the Peltier element serving as a thermo module can be utilized effectively and power can be utilized effectively.

Incidentally, in the embodiment shown in FIG. 1, the heat pipe has been provided on the heat exchange block which is positioned on the heat absorbing side of the Peltier element. However, when like mechanism may be provided on the side of the heat transferring means, heat resistance of the Peltier element on the heat radiating side can also be made small, so that the temperature difference between the heat radiating side and the heat absorbing side of the Peltier element serving as a thermo module can be utilized more effectively.

FIG. 2 is a sectional view showing another embodiment of the pipe cooler according to the present invention.

In the embodiment shown in FIG. 1, the heat transferring means of a water cooling type has been used, but in the embodiment shown in FIG. 2, heat transferring means of a air cooling type is used, which is different from the embodiment shown in FIG. 1. Other configurations of this embodiment are the same as those of the embodiment shown in FIG. 1.

In the embodiment shown in FIG. 2, a cooling plate 14 having many fins 15 are fixedly brought in close contact with the Peltier element 4 and a cover 11 having a fan 16 therein is provided so as to enclose a pipe cooler provided with the fins 15, so that cooling air flows along the fins 15.

The above cover 11 is formed in a square barrel shape, and it is provided at its one end with an air inlet port 12 through which air flows in, while it is provided at the other end with a side plate 13 having an air outlet port (not shown) through which air flows out.

Also, the above cover has been provided so as to enclose the fin portion of the pipe cooler with fins, but it is not necessarily required to cover the entire lengths of the fins in the axial direction of the fan. That is, as shown in FIG. 2(A), portions of the fins 15 may be exposed from the cover outside.

Also, as the above air inlet port 12, an opening which is provided at one end of the square barrel-shaped cover and through which the pipe cooler with fins is inserted may be used as it is.

Though the air outlet port is a grid-shaped opening provided in the side plate 13 of the cover 11, an opening at the other end of the square barrel-shaped cover may be used as it is without providing the side plate 13 on the cover 11, or the opening at the other end of the square barrel-shaped cover, which has been provided with a net may be used as the air outlet port.

Cooling air is sucked from the air inlet port 12 by the fan 16, it absorbs heat from the fins 15 while flowing in the axial direction, and it flows out from the air outlet port 13.

FIG. 3 is a sectional view showing an embodiment of a small-sized temperature controlling apparatus according to the present invention.

A small-sized temperature controlling apparatus 20 according to the present invention comprises a heat pipe(s) 2 and a heat exchange block 3 having a large heat capacity. At least one heat pipe 2 is mounted to the heat exchange block 3 through heat pipe supporting means 10 and has an end portion 2a which is inserted in the heat exchange block 3 to perform heat exchange with the heat exchange block 3 and a heat conduction extending portion 2b projecting from the heat exchange block 3, and heat from the heat exchange block 3 is conducted to heating medium about the heat conduction extending portion 2b.

Furthermore, in the small-sized temperature controlling apparatus 20 according to the present invention, Peltier elements 4 which are thermo modules are fixedly brought in close contact with surfaces of the heat exchange block 3, and heat transferring means 5 is disposed on a side of each Peltier element 4 which is opposed to the heat exchange block 3.

The heat transferring means 5 may be of a water cooling type having a cooling plate 6 in which cooling water flows, as shown in the embodiment of FIG. 1, or it may be of an air cooling type as shown in the embodiment of FIG. 2.

The heat exchange block 3 has a temperature sensor 8 therein, as shown in the embodiment of FIG. 1, and a signal from the temperature sensor 8 is sent to a temperature controller 9, so that the current flowing in the Peltier element 4 from a direct current power supply (not shown) is controlled by the temperature controller 9 and the temperature of the Peltier element 4 is controlled.

Also, like the case of the embodiment of FIG. 1, heating temperature control can be performed by reversing the direction of current flowing in the Peltier element 4 to heat the heating medium.

Furthermore, the small-sized temperature controlling apparatus 20 according to the present invention has a tube 23 through which erosive fluid flows and which is wound around the heat conduction extending portions 2b with a clearance, and the tube 23 and the heating medium 22 are accommodated in a heating medium accommodating casing 21 so as to come in contact with each other. The heating medium accommodating casing 21 has an inlet portion and an outlet portion (not shown) which the tube 23 penetrates in a liquid-tight manner and it is mounted at its right side to a side wall of the heat pipe supporting means 10 in a liquid-tight manner, so that the heating medium accommodating casing 21 forms a heating medium chamber therein.

The tube 23 is formed of fluorocarbon resin (PFA) such as Teflon (trademark) or the like, which has an excellent corrosion resistance, and erosive fluid flowing in the tube 23 is subjected to heat exchange with the heating medium 22 accommodated in the heating medium accommodating casing 21 to be cooled (or heated) during a period in which it flows in from an inlet portion 23a of the tube 23 and it flows out from an outlet portion 23b of the tube 23.

In the embodiment of FIG. 3, low melting point metal, for example, metal which is melted at a temperature lower than the melting point of the tube 23 or material having an excellent heat conductivity equivalent to the metal (for example, low temperature solder, heat conductive cement or the like) is used as the heating medium 22. It is preferable that such a casting structure is employed that each of these materials is caused to flow in the clearance between adjacent portions of the tube 23 and gaps between the heat conduction extending portions 2b and the tube 23 to be solidified.

Also, the heating medium 22 is not limited to the low melting point metal necessarily, but, for example, liquid material with a high heat conductivity and a large heat capacity such as epoxy resin including metal powder, gel including metal powder or the like may be used as the heating medium 22.

Figure 4:
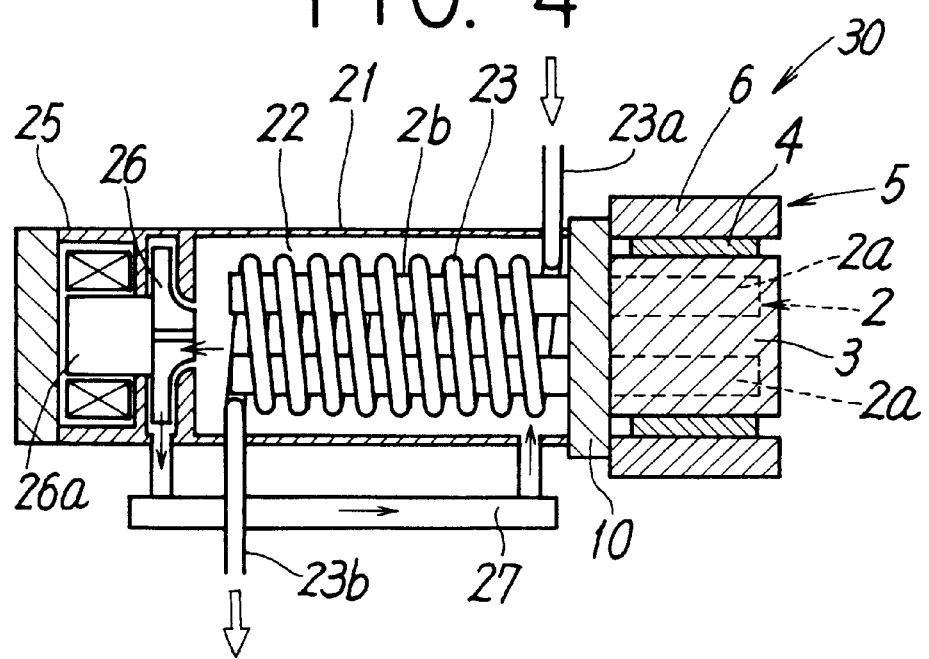
FIG. 4 is a partially cutout sectional view showing another embodiment of a small-sized temperature controlling apparatus according to the present invention.

FIG. 4 is a partially cutout sectional view showing another embodiment of the small-sized temperature controlling apparatus according to the present invention. In the embodiment of FIG. 3, the low melting point metal or the liquid material with a high heat conductivity and a large heat capacity has been used as the heating medium 22, but the embodiment of FIG. 4 is different from that of FIG. 3 in a point where circulating cooling liquid is used as the heating medium 22.

Accordingly, a small-sized temperature controlling apparatus 30 according to the embodiment of FIG. 4 comprises a heat pipe(s) 2 and a heat exchange block 3 having a large heat capacity. At least one heat pipe 2 is mounted to the heat exchange block 3 through heat pipe supporting means 10, the heat pipe 2 has an end portion 2a which is inserted in the heat exchange block 3 to perform heat exchange with the heat exchange block 3 and a heat conduction extending portion 2b projecting from the heat exchange block 3, so that heat from the heat exchange block 3 is conducted to heating medium 22 about the heat conduction extending portion 2b. Peltier elements 4 which are thermo modules are fixedly brought in close contact with surfaces of the heat exchange block 3, and heat transferring means 5 is disposed on a side of each Peltier element 4 which is opposed to the heat exchange block 3. Regarding these points, the embodiment of FIG. 4 is similar to the embodiment of FIG. 3.

In the embodiment of FIG. 4, a pump casing 25 is provided at one end of the heating medium accommodating casing 21, a tube 23 which is wound about the heat conduction extending portions 2b with gaps and through which erosive fluid flows is accommodated in the heating medium chamber formed within the heating medium accommodating casing 21, and a pump 26 and a pump driving motor 26a are accommodated in the pump casing 25.

Each of the heating medium accommodating casing 21 and the pump casing 25 has an inlet portion and an outlet portion (not shown) which the tube 23 penetrates in a liquid-tight manner, and it is mounted at its right end side to the side wall of the heat pipe supporting means 10 in a liquid-tight manner. Furthermore, a circulating pipe 27 for circulating circulation cooling liquid 22 discharged from a discharge port of the pump 26 rightward of the heating medium accommodating casing 21 is mounted to the heating medium accommodating casing 21 and the pump casing 25. The circulation cooling liquid 22 which has been discharged from the discharge port of he pump 26 is circulated rightward of the heating medium accommodating casing 21 through the circulating pipe 27, it is further moved leftward within the heating medium accommodating casing 21 to flow in the suction port of the pump 26 from the left end of the heating medium accommodating casing 21, and it is boosted by the pump 26 to be circulated in the circulating pipe 27, again.

The erosive fluid flowing in the tube 23 is subjected to heat exchange with the circulation cooling liquid 22 circulated within the heating medium accommodating casing 21 to be cooled (or heated) during a period in which it flows in from an inlet portion 23a of the tube 23 and it flows out from an outlet portion 23b of the tube 23.

Incidentally, in the embodiment of FIG. 4, the circulating pipe 27 is mounted outside the heating medium accommodating casing 21 and the pump casing 25. However, when such a structure is employed that a circulating passage is provided inside these heating medium accommodating casing 21 and the pump casing 25, and the circulation cooling liquid which has flown from the circulating passage is caused to flow in from an opening provided near the right end of the heating medium accommodating casing 21, the circulating pipe 27 can be omitted.

Figure 5A:
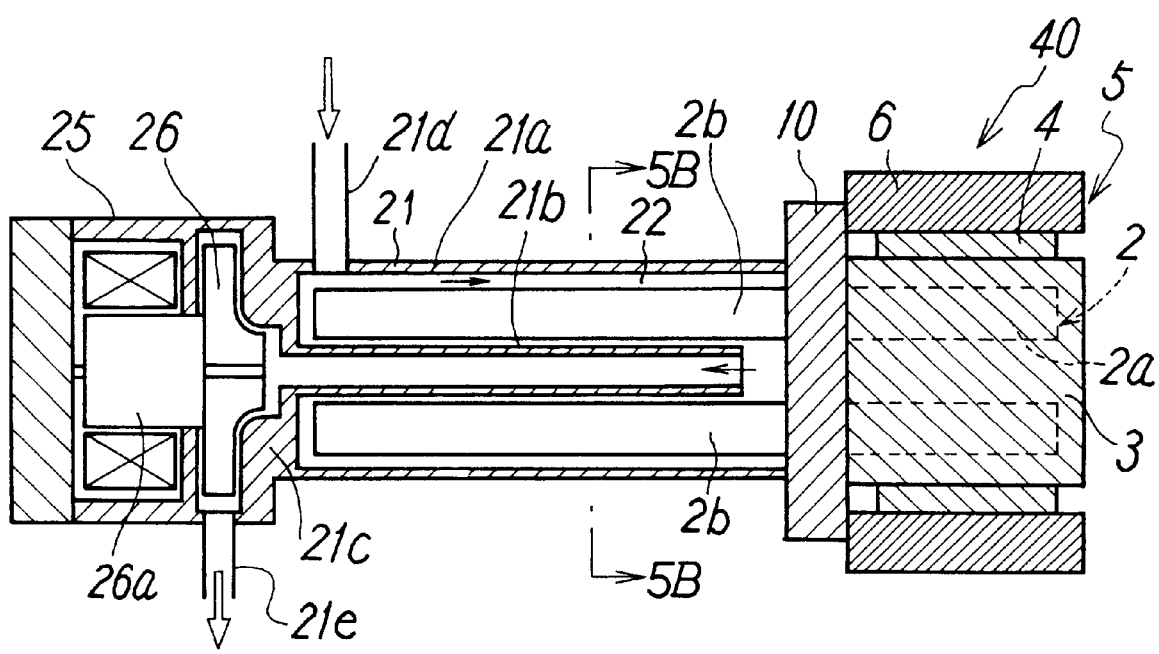
FIG. 5(A) is a sectional view showing still another embodiment of a small-sized temperature controlling apparatus according to the present invention.
Figure 5B:
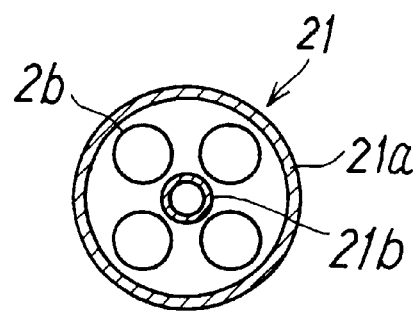
FIG. 5(B) is a sectional view taken along line 5B—5B in FIG. 5(A).
Figure 6:
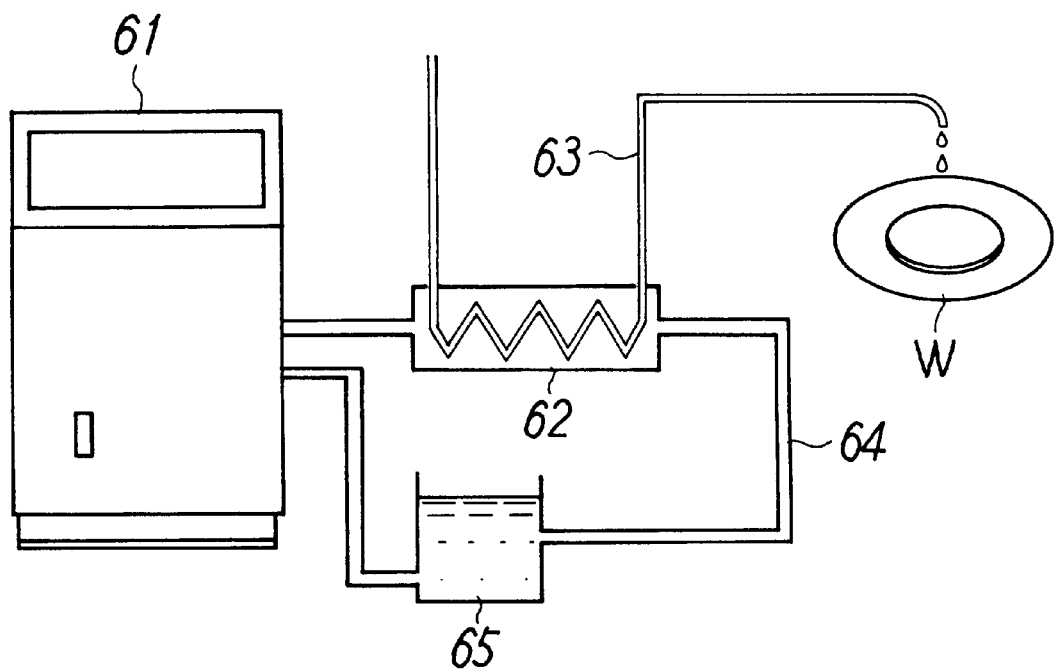
FIG. 6 is a block diagram showing a schematic configuration of a conventional apparatus.
Figure 7A:
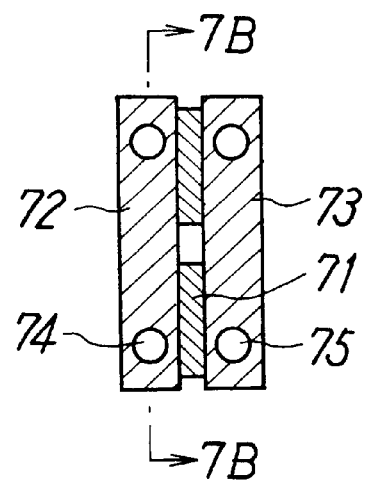
FIG. 7(A) and 7(B) are sectional views showing a conventional another apparatus, FIG. 7(A) being a sectional view taken along line 7A—7A in FIG. 7(B) and FIG. 7(B) being a sectional view taken along line 7B—7B in FIG. 7(A).
Figure 7B:
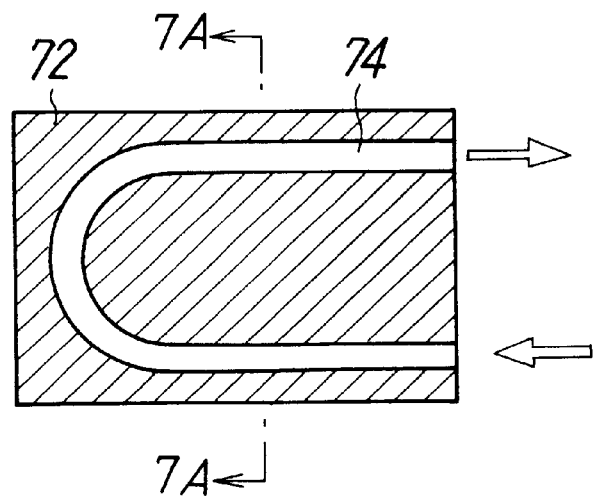

FIG. 5 is a sectional view showing still another embodiment of the small-sized temperature controlling apparatus according t o the present invention.

In the embodiment of FIG. 5, the circulation cooling liquid 22 is used as the heating medium like the embodiment of FIG. 4, but the embodiment of FIG. 5 is different from that of FIG. 4 in a point where the structure of the heating medium accommodating casing 21 is modified and the tube 23 through which erosive fluid flows, which has been accommodated in the heating medium accommodating casing 21 in the embodiment of FIG. 4, is provided outside the heating medium accommodating casing 21.

Accordingly, a small-sized temperature controlling apparatus 40 according to the embodiment of FIG. 5 is similar to the embodiment of FIG. 4 in a point where it comprises a heat pipe(s) 2 and a heat exchange block 3 having a large heat capacity. At least one heat pipe 2 is mounted to the heat exchange block 3 through heat pipe supporting means 10, the heat pipe 2 has an end portion 2a which is inserted in the heat exchange block 3 to perform heat exchange with the heat exchange block 3 and a heat conduction extending portion 2b projecting from the heat exchange block 3, so that heat from the heat exchange block 3 is conducted to heating medium 22 about the heat conduction extending portion 2b. Also, Peltier elements 4 which are thermo modules are fixedly brought in close contact with surfaces of the heat exchange block 3, and heat transferring means 5 is disposed on a side of each Peltier element 4 which is opposed to the heat exchange block 3. Regarding these points, the embodiment of FIG. 5 is similar to that of FIG. 4.

In the embodiment of FIG. 5, a pump casing 25 for accommodating the pump 26 is provided at one end of the heating medium accommodating casing 21. The heating medium accommodating casing 21 is formed in a double cylindrical shape having an outer cylindrical portion 21a and inner cylindrical portion 21b, the length of the inner cylindrical portion 21b in its axial direction is slightly shorter than that of the outer cylindrical portion 21a in the axial direction, a distal end of the inner cylindrical portion 21b is opened inside the outer cylindrical portion 21a, and a proximal end of the inner cylindrical portion 21b is opened inside the pump casing 25. Also, the left end of the outer cylindrical portion 21a is closed by a doughnut-shaped partition plate 21c, and the heat conduction extending portions 2b are accommodated in the heating medium chamber between the outer cylindrical portion 21a and the inner cylindrical portion 21b.

Also, the right end of the outer cylindrical portion 21a of the heating medium accommodating casing 21 is mounted to the side wall of the heat pipe supporting means 10 in a liquid-tight manner, and a pump driving motor 26b is provided inside the pump casing 25.

A heating medium flowing-in pipe 21d is connected to the outer cylindrical portion 21a of the heating medium accommodating casing 21, a heating medium flowing-out pipe 26d is connected to the pump casing 25, a heat exchanger (not shown) is connected between the heating medium flowing-out pipe 26d and the heating medium flowing-in pipe 21d, so that heat exchange between the heating medium and the erosive fluid flowing in the tube is performed in the heat exchanger.

The circulation cooling liquid 22 which has flown in the left end side of the heating medium accommodating casing 21 from the heating medium flowing-in pipe 21d is cooled (or heated) by the above heat conduction extending portions 2b while it flows in the direction of the right end within the heating medium accommodating casing 21, and, after the circulation cooling liquid 22 has reached the right end of the heating medium accommodating casing 21, it is reversed thereat to flow in the inner cylindrical portion 21b so that it is sucked in the pump 26.

Then, the circulation cooling liquid 22 which has been discharged from the discharge port of the pump casing 25 to the heating medium flowing-out pipe 21e is subjected to heat exchange with erosive fluid flowing in a tube within the heat exchanger (not shown), and thereafter it is returned back to the above heating medium flowing-in pipe 21d, again.

According to the pipe cooler of the present invention and the small-sized temperature controlling apparatus described in detail, since constant-temperature water is not used when erosive fluid is temperature-controlled with a high accuracy, an apparatus can be simplified and small-sized.

Also, according to the pipe cooler of the present invention and the small-sized temperature controlling apparatus, since the end portion of the heat pipe is heat-exchanged by the heat exchange block having a large heat capacity, and the heating medium about the heat conduction extending portion of the heat pipe projecting from the heat exchange block is temperature-controlled by operation control of the Peltier element via the heat conduction extending portion, the length and/or thickness of the heat conduction extending portion can be designed freely without restraint in the size of the heat exchange block, and the heat conduction extending portion of the heat pipe can be formed in an enlarged heat conducting surface, so that heat can sufficiently be conducted to the heating medium about the heat conduction extending portion.

Accordingly, since the heat resistance of the Peltier element on its heat absorbing side can be made small, the temperature difference between the heat radiating side and the heat absorbing side of the Peltier element serving as the thermo module can be utilized effectively, thereby saving power.

Furthermore, since the Peltier element is used as the thermo module, the heating medium about the heat conduction extending portion can be temperature-controlled by the operation control of the Peltier element easily, with an excellent response, and accurately. Simultaneously, in a temperature controlling apparatus using a conventional thermo module, heat conducting area is limited by the shape/size of the thermo module, but the heat conduction extending portion of the heat pipe of the present invention can be designed freely as an enlarged heat conducting surface, so that the heat conduction extending portion can be designed optimally so as to conform with the size required for a heat exchanger.

Also, according to the pipe cooler of the present invention and the small-sized temperature controlling apparatus, since the pipe cooler is configured, it is applicable to a dispenser temperature controlling apparatus (for heat conduction to solid) and a circulator (for heat conduction to liquid) which are different in heat conduction aspect from each other in a state where it has the same structure and the same aspect.

What is claimed is:

1. A pipe cooler comprising at least one heat pipe having an end portion for heat exchange and a heat conduction extending portion extending form the end portion, a heat exchange block for performing heat exchange with the end portion of the at least one heat pipe, at least one Peltier element which is fixedly brought in close contact with a surface of the heat exchange block, and heat transferring means which is provided on a surface of each Peltier element which is opposed to the heat exchange block, wherein heating medium about the heat conduction extending portion is temperature-controlled by controlling the Peltier element via the heat exchange block and the heat pipe.

2. A pipe cooler according to claim 1, wherein the heat transferring means is structured so as to radiate heat from a heating surface of the Peltier element by water cooling or air cooling.

3. A pipe cooler according to claim 1, wherein the heat exchange block has a polygonal sectional configuration, the heat exchange block is mounted at its one end face with end portions of a plurality of heat pipes in an embedded state, and the Peltier elements are mounted to a plurality of side faces around the one end face.

4. A pipe cooler according to claim 3, wherein the heat transferring means is cooling plates each having a flow passage for cooling water therein, and the flow passages of the respective cooling plates are mutually connected by a pipe.

5. A pipe cooler according to claim 3, wherein the heat transferring means comprises cooling plates each having a plurality of fins for heat radiation, a rectangular cover is mounted to the heat exchange block so as to enclose the fins of the respective cooling plates, and a fan is provided inside the cover.

6. A small-sized temperature controlling apparatus comprising a pipe cooler according to any one of claims 1 to 5, a heating medium accommodating casing which encloses the heat conduction extending portion of the heat pipe, a heating medium chamber formed inside the heating medium accommodating casing, and heating medium which is accommodated in the heating medium chamber so as to come into contact with the heat conduction extending portion of the heat pipe.

7. A small-sized temperature controlling apparatus according to claim 6, wherein a tube for allowing flow of fluid to be temperature-controlled is provided within the heating medium chamber so as to wind the heat conduction extending portion of the heat pipe and comes into contact with the heating medium.

8. A small-sized temperature controlling apparatus according to claim 6, wherein the heating medium is liquid, a pump casing is provided at one end of the heating medium accommodating casing, and a pump for circulating the heating medium is accommodated within the pump casing.

9. A small-sized temperature controlling apparatus according to claim 7, wherein the heating medium is liquid, a pump casing is provided at one end of the heating medium accommodating casing, and a pump for circulating the heating medium is accommodated within the pump casing.

10. A small-sized temperature controlling apparatus according to claim 8, wherein the heating medium accommodating casing is formed in a double cylindrical shape comprising an outer cylindrical portion and an inner cylindrical portion, the heating medium chamber is formed between the both cylindrical portions, the heating medium chamber and the pump casing communicate with each other via the inner cylindrical portion, and the heat conduction extending portion of the heat pipe is accommodated between the outer cylindrical portion and the inner cylindrical portion.

11. A small-sized temperature controlling apparatus according to claim 9, wherein the heating medium accommodating casing is formed in a double cylindrical shape comprising an outer cylindrical portion and an inner cylindrical portion, the heating medium chamber is formed between the both cylindrical portions, the heating medium chamber and the pump casing communicate with each other via the inner cylindrical portion, and the heat conduction extending portion of the heat pipe is accommodated between the outer cylindrical portion and the inner cylindrical portion.

* * * * *